United States Patent
Liu et al.

(10) Patent No.: US 7,745,995 B2
(45) Date of Patent: Jun. 29, 2010

(54) FLAT PANEL DISPLAY HAVING NON-EVAPORABLE GETTER MATERIAL

(75) Inventors: Liang Liu, Beijing (CN); Jie Tang, Beijing (CN); Cai-Lin Guo, Beijing (CN); Bing-Chu Du, Beijing (CN); Zhao-Fu Hu, Beijing (CN); Pi-Jin Chen, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 506 days.

(21) Appl. No.: 11/432,745

(22) Filed: May 10, 2006

(65) Prior Publication Data

US 2006/0279197 A1    Dec. 14, 2006

(51) Int. Cl.
*H01J 17/24* (2006.01)
(52) U.S. Cl. ...................... 313/554; 313/495
(58) Field of Classification Search ......... 313/495–497, 313/553, 559, 554
See application file for complete search history.

(56) References Cited

U.S. PATENT DOCUMENTS

| 5,545,946 | A | 8/1996 | Wiemann |
| 6,787,982 | B2 | 9/2004 | Ryu et al. |
| 6,838,822 | B2 | 1/2005 | Yonezawa et al. |
| 2002/0079839 | A1 | 6/2002 | Kokubu |
| 2003/0007883 | A1 | 1/2003 | Toia et al. |
| 2003/0052601 | A1 | 3/2003 | Kokubu |
| 2003/0160561 | A1* | 8/2003 | Park et al. .................. 313/495 |
| 2004/0075377 | A1 | 4/2004 | Chen |
| 2004/0169469 | A1 | 9/2004 | Hasegawa |
| 2004/0217688 | A1* | 11/2004 | Hirasawa et al. ........... 313/497 |
| 2005/0062415 | A1* | 3/2005 | Yonezawa et al. .......... 313/553 |

FOREIGN PATENT DOCUMENTS

| JP | 7245071 | 9/1995 |
| JP | 8167394 | 6/1996 |
| JP | 11111201 | 4/1999 |
| TW | 373221 | 11/1999 |
| TW | 495795 | 7/2002 |

* cited by examiner

*Primary Examiner*—Nimeshkumar D Patel
*Assistant Examiner*—Mary Ellen Bowman
(74) *Attorney, Agent, or Firm*—Jeffrey T. Knapp

(57) ABSTRACT

A flat panel display (7) generally includes a front substrate (79) and a rear substrate (70) opposite thereto. The front substrate is formed with an anode (78). The rear substrate is formed with a cathode (71) facing the anode. Several sidewalls (72) are interposed between the front substrate and the rear substrate. A plurality of getter devices (82) are arranged on the front substrate. Thereby, a chamber between the front substrate and the rear substrate is maintained as a low-pressure vacuum. Each of the getter devices includes a base (820), a getter layer (822) comprised of non-evaporable getter material formed thereon, and securing wires (84) arranged on the base.

16 Claims, 2 Drawing Sheets

FLAT PANEL DISPLAY HAVING NON-EVAPORABLE GETTER MATERIAL

CROSS-REFERENCE TO RELATED APPLICATION

This application is related to a copending U.S. patent application Ser. No. 11/432,241 filed May 10, 2006 entitled "FLAT PANEL DISPLAY HAVING NON-EVAPORABLE GETTER MATERIAL" with the same assignee. The disclosure of the above-identified application is incorporated herein by reference.

BACKGROUND

1. Field of the Invention

The present invention relates to a flat panel display, and particularly to a flat panel display having non-evaporable getter material.

2. Discussion of the Related Art

Flat panel displays are packaged vacuum microelectronic devices that are used in connection with computers, television sets, camcorder viewfinders, and other electronic devices. Flat panel displays generally have a rear plate and a front plate facing one another across a narrow vacuum gap. In large flat panel displays, a number of spacers are positioned between the rear plate and the front plate to prevent atmospheric pressure from collapsing the plates together. The rear plate typically has a base substrate upon which a number of sharp, cone-shaped emitters are formed, an insulator layer positioned on the substrate having apertures through which the emitters extend, and an extraction grid formed on the insulator layer around the apertures.

One problem with flat panel displays is that the internal components continuously outgas, which causes the performance of flat panel displays to degrade over time. The effects of outgassing are minimized by placing a special material to absorb the gas (commonly called getter material) within the sealed vacuum space. Accordingly, in order to absorb the gas in the vacuum chamber over a flat panel display's lifetime, a sufficient amount of getter material must be incorporated into the flat panel display before it is sealed.

The getter material generally includes two types: evaporable, and non-evaporable. The former is not suitable for use in flat panel displays because of the possible short-circuit caused by evaporating metal film. When non-evaporable getter materials are used, they are usually arranged in a corner of the flat panel device, but the conductance from the outgassing site to these getters are limited by the narrow space between the flat plates, causing reduction of the getters' absorption efficiency and in consequence the display's performance and lifetime. There are also according solutions in which a separate space for containing getter materials is added to the device, but the structure thereof becomes complicated and the manufacture cost will be increased.

What is needed, therefore is to provide a flat panel display having non-evaporable getter material that has a high absorption efficiency.

SUMMARY

A flat panel display provided herein generally includes: a first substrate including a first region and a second region adjacent thereto. An anode formed on the first region thereof; a plurality of getter devices arranged on the second region thereof, each of the getter devices including a main body and a securing member configured for fixing the main body on the first substrate, the main body comprised of non-evaporable getter materials; a second substrate arranged opposite to the first substrate and facing the first and second regions thereof; and a plurality of sidewalls interposed therebetween, each of the sidewalls having one end connecting with the second region of the first substrate.

These and other features, aspects, and advantages of the present backlight device will become more apparent from the following detailed description and claims, and the accompanying drawings.

BRIEF DESCRIPTION OF THE DRAWINGS

Many aspects of the present flat panel display can be better understood with reference to the following drawings. The components in the drawings are not necessarily drawn to scale, the emphasis instead being placed upon clearly illustrating the principles of the present flat panel display. Moreover, in the drawings, like reference numerals designate corresponding parts throughout the several views.

DETAILED DESCRIPTION OF THE PREFERRED EMBODIMENTS

Figure 1:
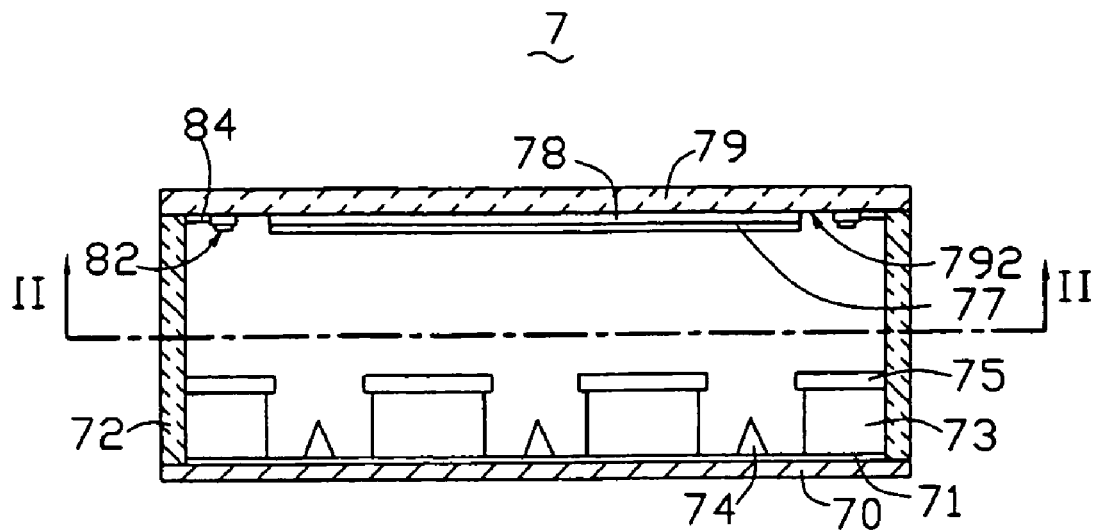
FIG. 1 is a schematic, cross-sectional view of a flat panel display in accordance with a first embodiment.

Referring to FIG. 1, a flat panel display 7 is shown in accordance with a first embodiment. The flat panel display 7 generally includes a front substrate 79 and a rear substrate 70 opposite thereto. The front substrate 79 is formed with an anode 78. The rear substrate 70 is formed with a cathode 71 facing the anode 78. Several sidewalls 72 are interposed between the front substrate 79 and the rear substrate 70. A plurality of getter devices 82 are arranged on the front substrate 79. Thereby, a substantial vacuum is maintained in a chamber between the front substrate 79 and the rear substrate 70.

In the illustrated embodiment, the rear substrate 70 is made of glass, plastics, or other suitable materials. The cathode 71 is an electrically conductive layer, and formed on a surface of the rear substrate 70 facing the anode 78. A plurality of emitters 74 are formed on the cathode 71, for emitting electrons. The emitters 74 can be composed of carbon nanotubes, diamond, diamond-like carbon (DLC), silicon, or of a tip-shaped metal material. The cathode 71 is also formed with an insulating layer 73. The insulating layer 73 includes a plurality of tiny through holes corresponding to the emitters 74, exposing the emitters 74. A plurality of grid electrodes 75 are formed on a top surface of the insulating layer 73, for extracting electrons from the emitters 74.

Figure 2:
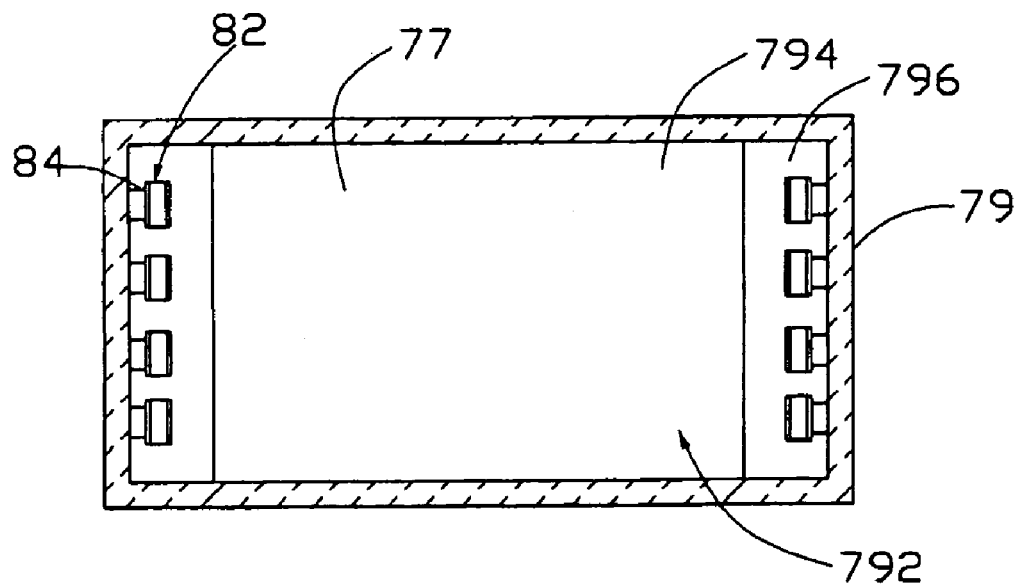
FIG. 2 is a schematic, cross-sectional view of the flat panel display of FIG. 1, taken along line II-II thereof, showing a front substrate having a plurality of getter devices from a bottom surface of the flat panel display.

Referring to FIGS. 1 and 2, the front substrate 79 has a cathode-facing surface 792. The surface 792 includes a middle region 794 and edge regions 796 surrounding the middle region 794 and adjacent to the sidewalls 72. The anode 78 is a conductive layer formed on the middle region 794, and is generally made of indium-tin oxide. Fluorescent layers 77 are formed on an emitter-facing surface of the anode 78. Considering the distribution of the emitters 74 and the cost, the anode 78 and the fluorescent layers 77 are not arranged on the edge regions 796 of the surface 792.

Referring to FIGS. 1 and 2, the getter devices 82 are arranged on the edge regions 796 of the surface 792. Each of the getter devices 82 includes two securing wires 84 connecting with the neighboring sidewall 72, for fixing the getter devices 82. Because gas can easily enter into the flat panel display 7 via those connections between the front substrate 79 and the sidewalls 72, the arrangement of the getter devices 82 close to the connections is beneficial for absorbing the unnecessary gas. The getter devices 82 are separated a substantially equal distance from each other, and are symmetrically distributed on the edge regions 796 of the surface 792, for uniformly absorbing the gas in the chamber of the flat panel display 7. Thereby, an absorption efficiency will be obviously increased, and gas pressure of everywhere of the chamber of the flat panel display 7 will become more uniform. Accordingly, the flat panel display 7 will have a longer life.

Figure 3:
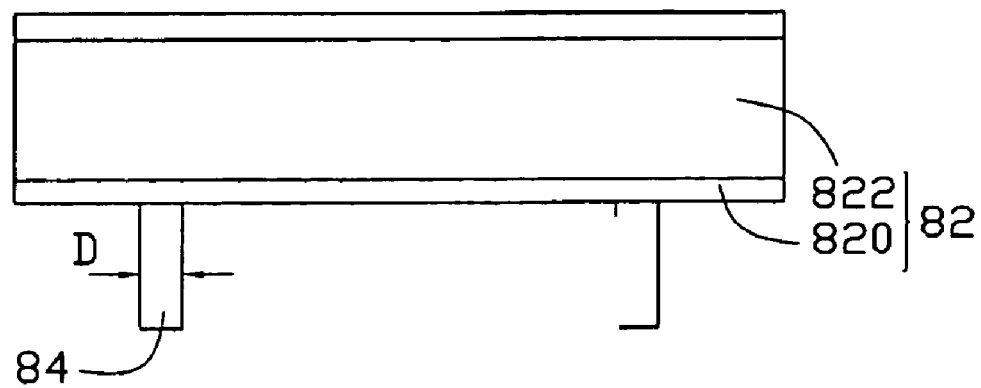
FIG. 3 is an enlarged view of the getter device of FIGS. 1 and 2.

Referring to FIG. 3, the getter device 82 includes a base 820, a getter layer 822 comprised of non-evaporable getter material formed thereon, and two securing wires 84 arranged on the base 820. The base 820 is advantageously a metal sheet. The getter layer 822 may be deposited on the base 820 by electroplating, screen printing, settling out of solution, electrophoresis processing, or other suitable deposition processes. The non-evaporable getter material is selected from the group consisting of titanium, zirconium, molybdenum, thorium, hafnium, an alloy comprised of at least two of the above metals, and other suitable metal material. The securing wires 84 are metal wires, and advantageously have a diameter in the range from about 0.1 mm to about 0.2 mm. Each of the securing wires includes one end arranged on the same side of the base 820, and another opposite end connecting with one of the neighboring sidewalls 72.

In the illustrated embodiment, the getter layer 822 is distributed on a middle region of the base 820. That is, edge regions of the base 820 are not formed with the non-evaporable getter material, for arranging the securing wires 84. The getter layer 822 could be arranged on the whole surface of the base 820, or be arranged on only one side of the base 820. Otherwise, the getter device 82 can be similarly arranged on other sidewalls 72.

Figure 4:
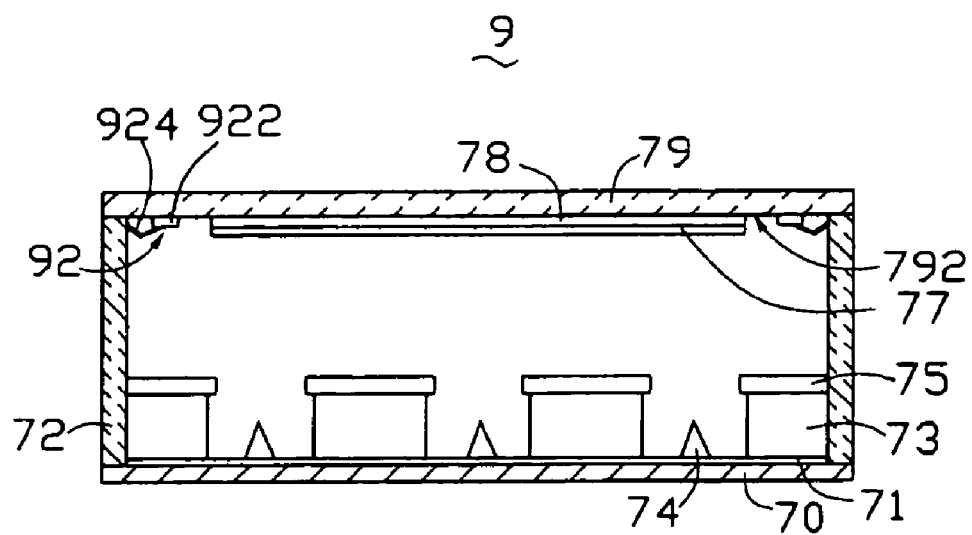
FIG. 4 is a schematic, cross-sectional view of a flat panel display in accordance with a second embodiment.

Referring to FIG. 4, another flat panel display 9 is shown in accordance with a second embodiment. The flat panel display 9 includes the front substrate 79 formed with the anode 78 thereon, the rear substrate 70 opposite to the front substrate 79, and sidewalls 72 interposed between the front and rear substrates 79, 70. A plurality of getter devices 92 are arranged on two sides of the front substrate 79 neighboring the sidewalls 72.

In the second embodiment, each of the getter devices 92 includes a main body 922 and a metal clip 924 arranged thereon. The main body 922 is a thin sheet comprised of the above mentioned non-evaporable getter materials. The metal clip 924 has one end working as an elastic arm and contacting the main body 922, for securing the main body 922 on the front substrate 79. Another end of the metal clip 924 is fixed on one of the sidewalls 72.

It should be further noted that the above-described flat panel displays 7, 9 have been provided for the purposes of illustrating the present invention. The flat panel displays 7, 9 are not critical to practicing the present invention. A variety of conventional flat panel displays are known to those skilled in the art, and these may be suitably adapted for practicing the present invention. In particular, the dimensions and numbers of the getter devices 82, 92 are exemplified herein for illustration purposes only, and are not intended to limit the present invention.

Finally, while the present invention has been described with reference to particular embodiments, the description is illustrative of the invention and is not to be construed as limiting the invention. Therefore, various modifications can be made to the embodiments by those skilled in the art without departing from the true spirit and scope of the invention as defined by the appended claims.

What is claimed is:

1. A flat panel display comprising:
   a first substrate comprising a middle region, a first edge region and a second edge region, the first edge region and the second edge region being at opposite sides of the middle region;
   an anode located on the middle region of the first substrate;
   a plurality of getter devices, the getter devices are located in at least one of the first edge region and the second edge region and are arranged a substantially equal distance from each other, each of the getter devices comprising a main body and at least one securing member fixing the main body on the first substrate, and the main body comprises of non-evaporable getter materials;
   a second substrate arranged opposite to the first substrate and facing the first and second regions of the first substrate; and
   a plurality of sidewalls interposed between the first and second substrates, each of the sidewalls having one end connecting with the second region of the first substrate, wherein the at least one securing member comprises a first end connecting to the main body of the getter device, and a second end fixed to one of the sidewalls.

2. A flat panel display comprising:
   a transparent substrate
   an anode formed on the transparent substrate;
   a plurality of sidewalls connecting with the transparent substrate; and
   a plurality of getter devices arranged on the transparent substrate and adjacent to a connection between the transparent substrate and one of the sidewalls, the getter devices being fixed to one of the sidewalls, the getter devices adjacent to the connection being arranged a substantially equal distance from each other, each of the getter devices comprising a main body and at least one securing member fixing the main body on the transparent substrate, and the main body comprises of non-evaporable getter material.

3. The flat panel display according to claim 1, wherein the securing member is a metal clip or metal wire.

4. The flat panel display according to claim 1, wherein the main body comprises a base and a getter layer with the non-evaporable getter material dispersed therein, the getter layer is supported by the base, and the first end of the at least one securing member is fixed to the base.

5. The flat panel display according to claim 4, wherein a field emission cathode device is arranged on the second substrate, the field emission cathode device comprising an electrically conductive layer and a plurality of emitters formed on the electrically conductive layer, and a projection of the getter devices on the second substrate is outside of an area occupied by the emitters.

6. The flat panel display according to claim 4, wherein the base is a metal sheet.

7. The flat panel display according to claim 2, further comprising a securing member comprising a first portion extending out from one of the getter devices and a second portion fixed to the one of the sidewalls.

8. The flat panel display according to claim 7, wherein the securing member is a wire, which has one portion extending out from the one of the getter devices thereby forming the first portion and another portion fixed to the one of the sidewalls thereby forming the second portion.

9. A flat panel display comprising:
- a first substrate having an area defined by a periphery of the first substrate;
- an anode formed on the first substrate;
- a first group of getter devices located at a first common side of the anode within the area defined by the first substrate, the getter devices of the first group being spaced from each other;
- a second group of getter devices located at a second common side of the anode within the area defined by the first substrate, the getter devices of the second group being spaced from each other; and
- a plurality of sidewalls extending from the periphery of the first substrate;
- wherein each of the getter devices of the first group and the second group comprises a securing member, a base, and a getter layer mounted on the base and having non-evaporable getter material dispersed therein; wherein the securing member comprises a first portion extending from the base to fix the base on the first substrate and independent from the getter layer and a second portion fixed to one of the sidewalls.

10. The flat panel display according to claim 9, wherein the first common side and the second common side are located at opposite sides of the anode.

11. The flat panel display according to claim 9, wherein the securing member is a metal wire with opposite ends fixing to the base and the one of the sidewalls, respectively.

12. The flat panel display according to claim 9, wherein the getter devices of the first group are arranged along a first line and the getter devices of the second group are arranged in a second line parallel to the first line.

13. The flat panel display according to claim 9, wherein the getter devices of the first group are arranged along a first line, and the first line extends along a connection between the first substrate and the one of the sidewalls which the getter devices of the first group mounted on.

14. The flat panel display according to claim 9, further comprising:
- a second substrate arranged opposite to the first substrate, the sidewalls are located between the first and second substrates;
- a field emission cathode device comprising an electrically conductive layer arranged on the second substrate and a plurality of emitters located on the electrically conductive layer;
- an insulating layer located on the electrically conductive layer;
- a plurality of tiny through holes defined through the insulating layer corresponding to and exposing the emitters; and
- a plurality of grid electrodes located on a top surface of the insulating layer for extracting electrons from the emitters.

15. The flat panel display according to claim 14, wherein the grid electrodes directly face both of the insulating layer and the getter devices of the first group and the second group.

16. The flat panel display according to claim 14, wherein a projection of the getter devices of the first group and the second group on the second substrate is within an area occupied by the insulating layer.

* * * * *